(12) United States Patent
Chin et al.

(10) Patent No.: US 6,464,578 B1
(45) Date of Patent: Oct. 15, 2002

(54) FAN AND HOOD ARRANGEMENT

(75) Inventors: Ming-Hwa Chin; Hsiang-Hsiang Tsai, both of Taoyuan Hsien (TW)

(73) Assignee: Enlight Corporation (TW)

( * ) Notice: Subject to any disclaimer, the term of this patent is extended or adjusted under 35 U.S.C. 154(b) by 0 days.

(21) Appl. No.: 09/983,311

(22) Filed: Oct. 24, 2001

(51) Int. Cl.⁷ .............................................. H05K 7/20
(52) U.S. Cl. ...................................... 454/184; 361/695
(58) Field of Search ................... 454/184; 361/687, 361/695, 697

(56) References Cited

U.S. PATENT DOCUMENTS

| | | | |
|---|---|---|---|
| 5,871,396 A | * 2/1999 | Shen | 361/695 |
| 6,113,485 A | * 9/2000 | Marquis et al. | 165/121 |
| 6,155,920 A | * 12/2000 | Pan et al. | 361/695 |
| 6,174,231 B1 | * 1/2001 | Bodin | 454/184 |

* cited by examiner

*Primary Examiner*—Harold Joyce
(74) *Attorney, Agent, or Firm*—Troxell Law Office PLLC

(57) ABSTRACT

A fan and hood arrangement includes a mounting shell fastened to the inside of a computer mainframe shell to hold a fan, and a hood pivoted to the mounting shell by a slip joint and fixed thereto by a lock screw, the fan having a mounting flange engaged into a gap between a partition board and stop blocks in the mounting shell, the mounting shell having inside spring plates, each spring plate having a retaining rod forced into engagement with a respective locating hole in the mounting flange of the fan.

1 Claim, 7 Drawing Sheets

FAN AND HOOD ARRANGEMENT

BACKGROUND OF THE INVENTION

The present invention relates a fan and hood arrangement for use in a computer to dissipate heat from the CPU and, more particularly, to such a fan and hood arrangement, which enables the angular position of the hood to be conveniently adjusted relative to the fan to guide currents of air to the assigned area.

Conventionally, a heat sink is used with a fan to dissipate heat from the CPU of the motherboard in a computer. This arrangement is less effect. Because the fan causes currents of air toward the heat sink and the CPU, outside cooling air cannot be directly drawn into the inside of the computer to cool the CPU.

SUMMARY OF THE INVENTION

The present invention has been accomplished to provide a fan and hood arrangement, which eliminates the aforesaid drawback. According to one aspect of the present invention, the fan and hood arrangement comprises a mounting shell, which is fixedly fastened to the mainframe shell of the computer with screws, a fan mounted inside the mounting shell and adapted to draw outside cooling air into the inside of the computer mainframe shell, and a hood coupled to the mounting shell and adapted to guide cooling air to the heat sink and the CPU of the motherboard in the computer mainframe shell. According to another aspect of the present invention, the hood is coupled to the mounting shell by a slip joint, and a lock screw is used to fix the hood to the mounting shell in position.

DETAILED DESCRIPTION OF THE PREFERRED EMBODIMENT

Figure 1:
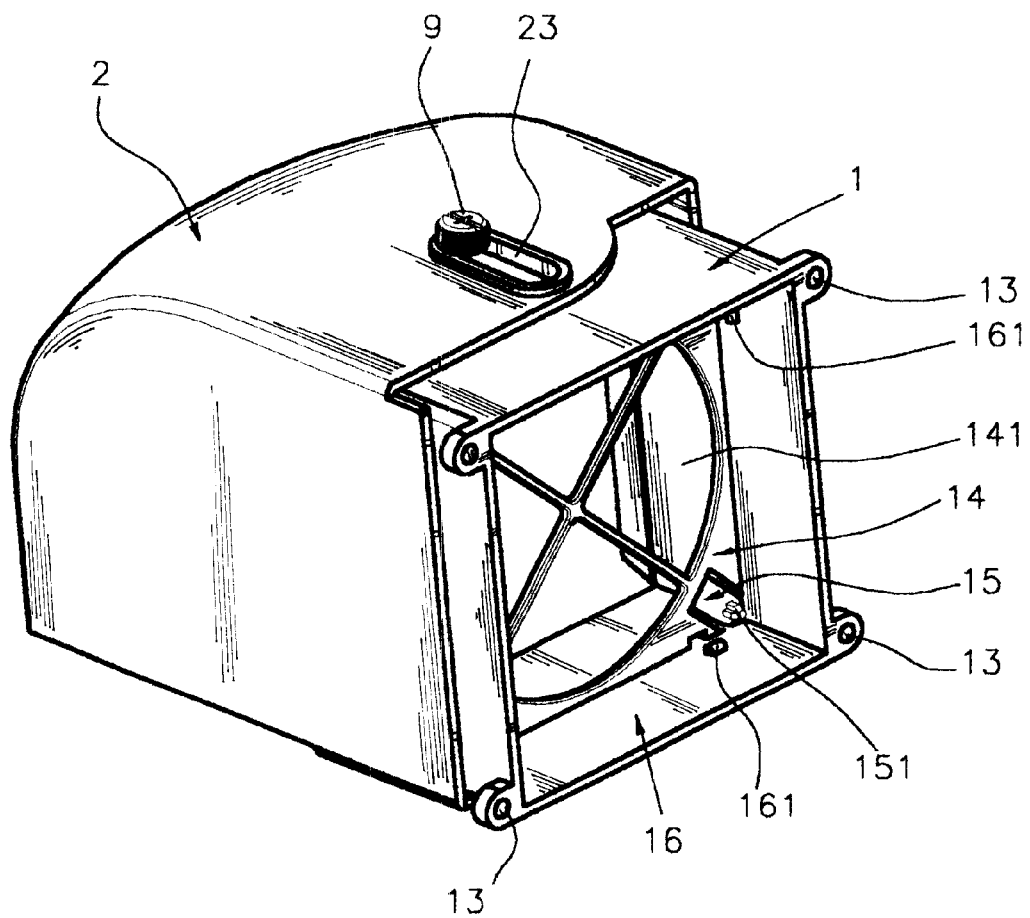
FIG. 1 is an elevational view of a part of the fan and hood arrangement according to the present invention showing the hood coupled to the mounting shell (the fan excluded).
Figure 2:
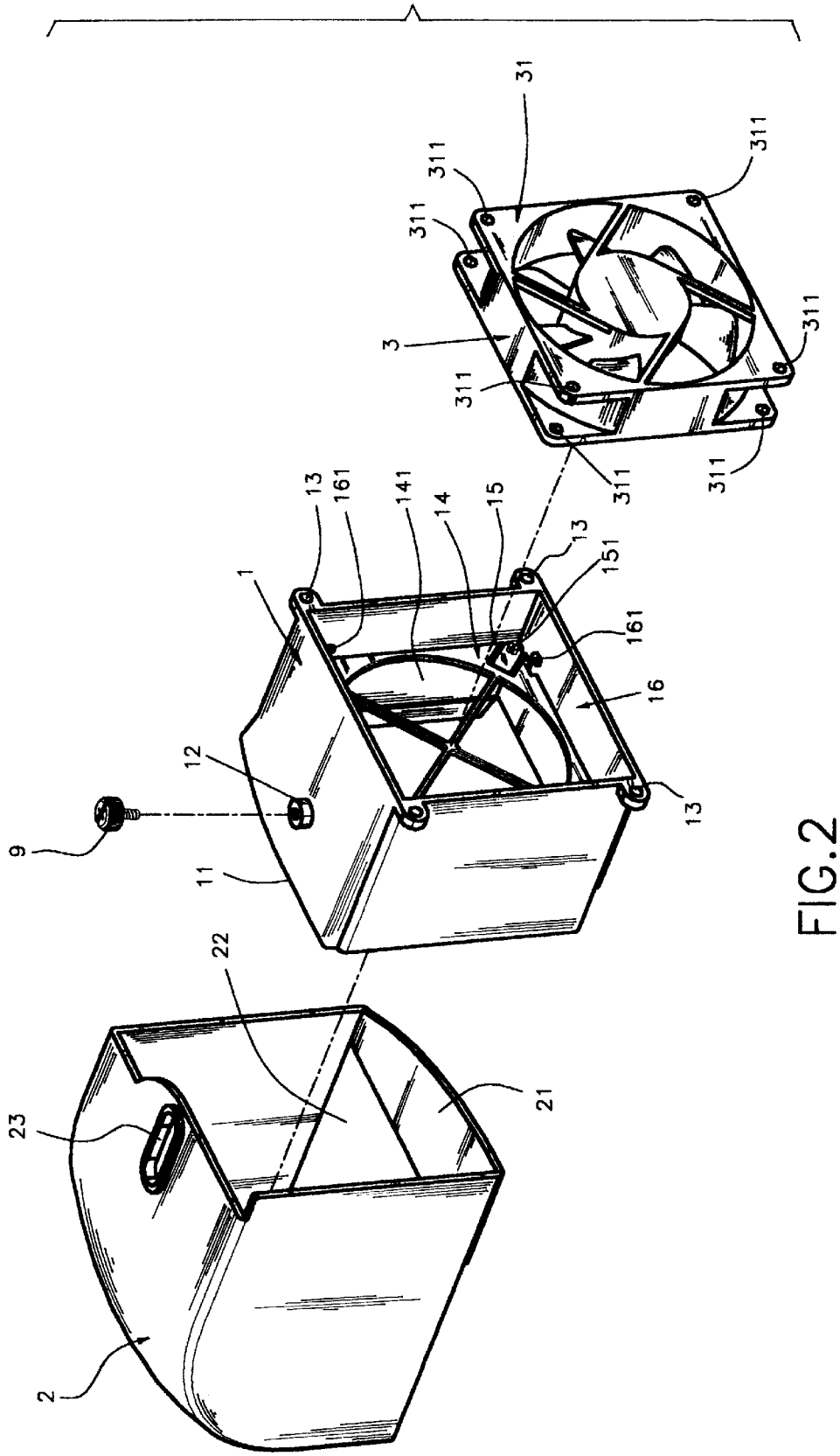
FIG. 2 is an exploded view of the fan and hood arrangement according to the present invention.
Figure 5:
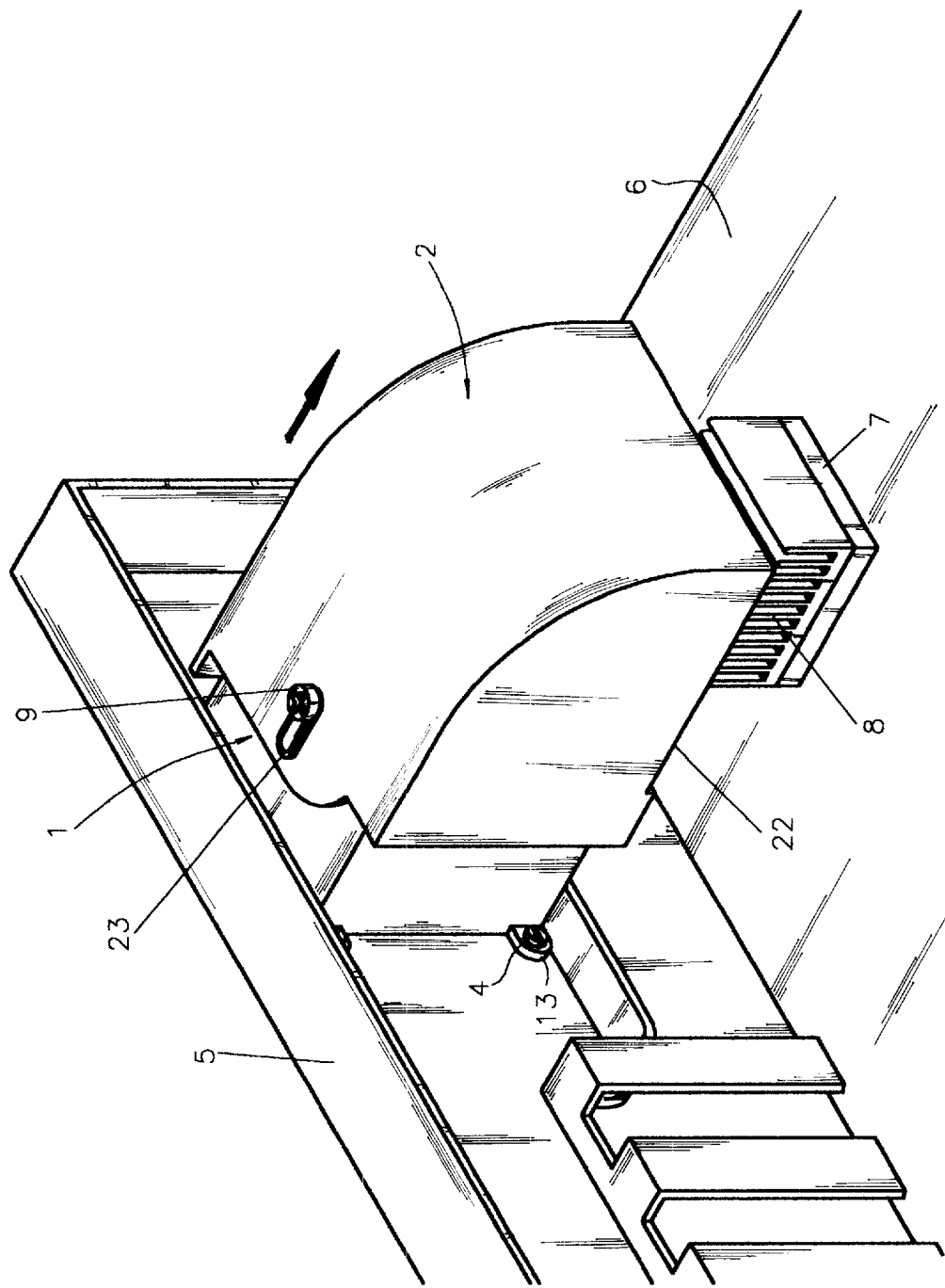
FIG. 5 is an installed view of the present invention showing the fan and hood arrangement installed in a computer mainframe shell, the position of the hood adjusted relative to the mounting shell.
Figure 6:
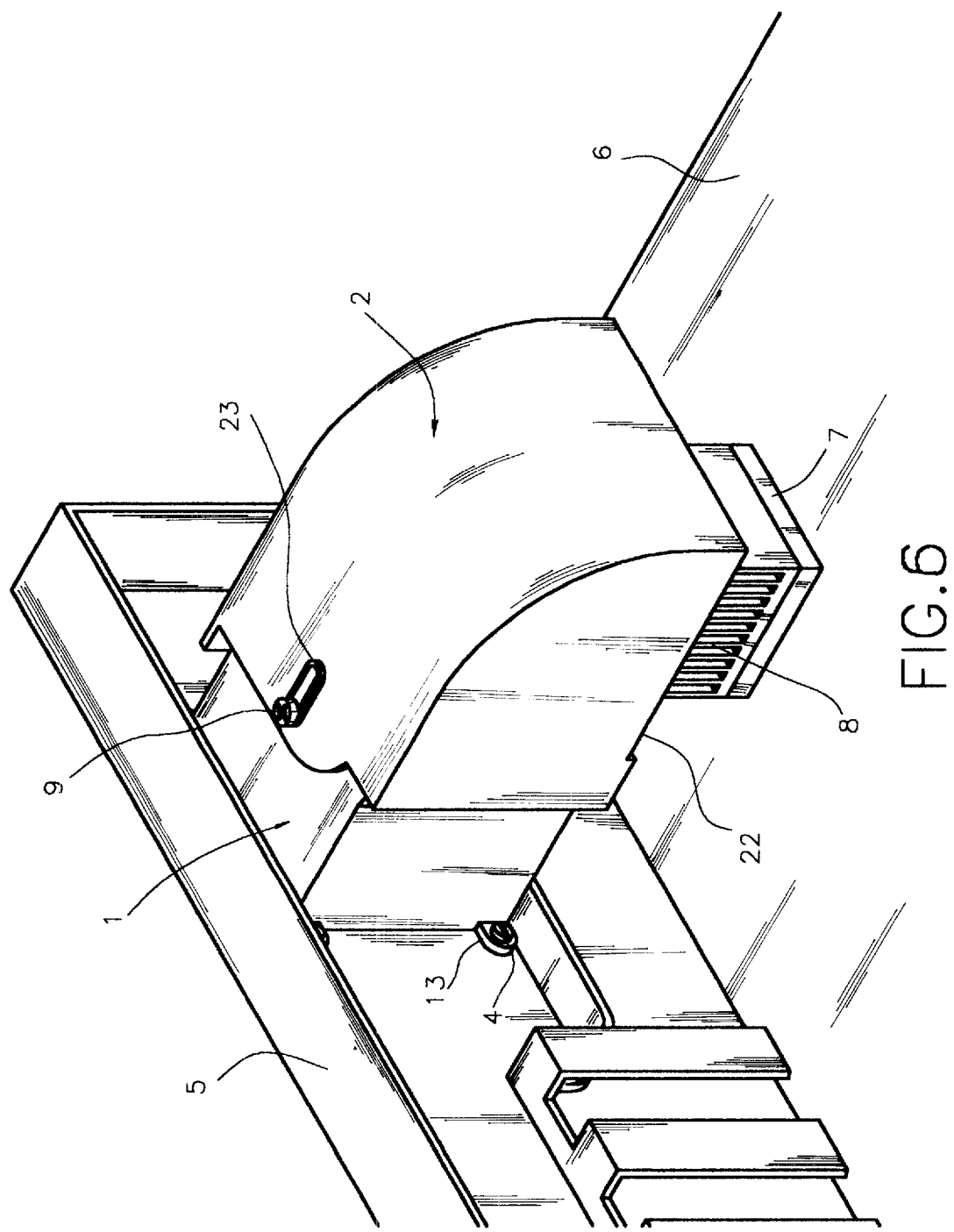
FIG. 6 is similar to FIG. 5 but showing the hood fixed in an extended position.
Figure 7:
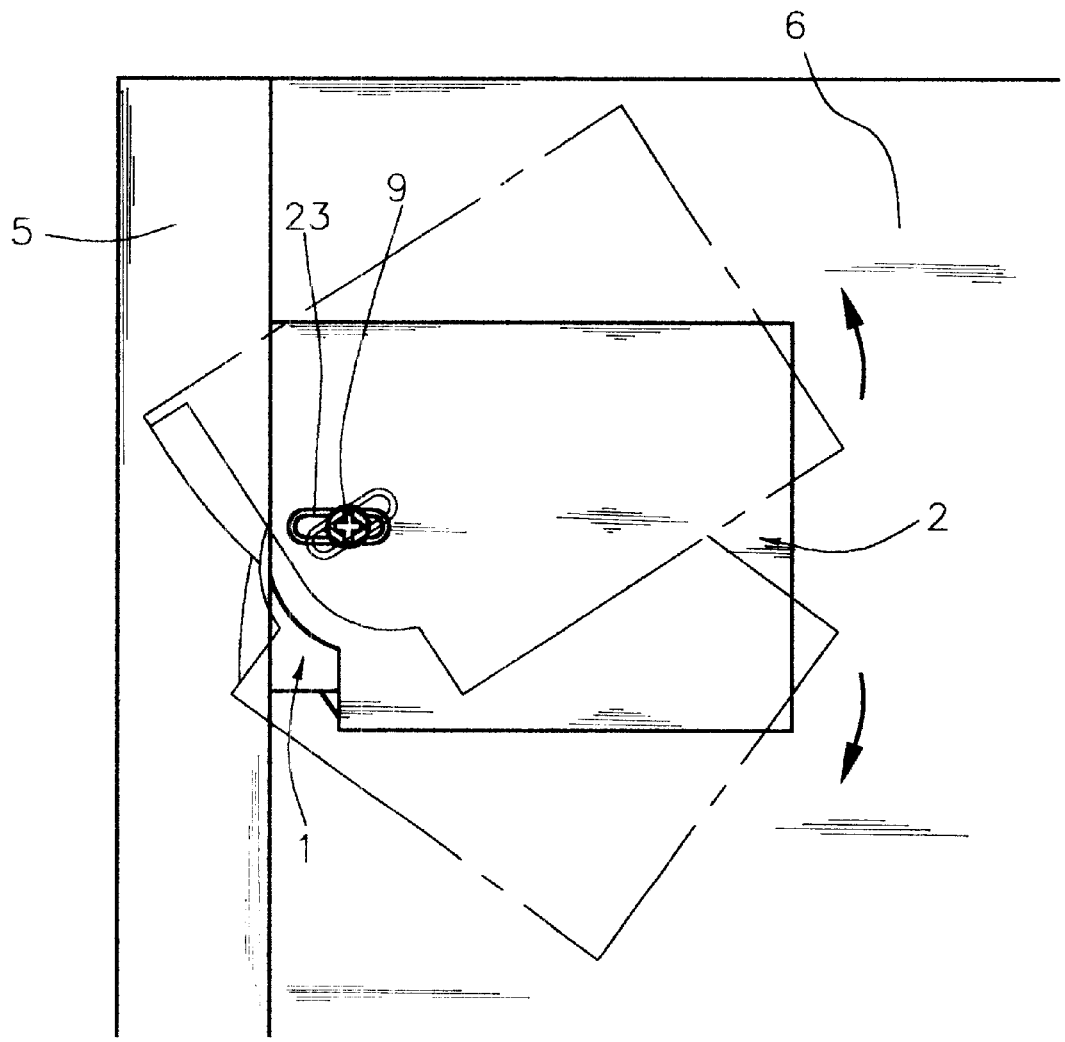
FIG. 7 is a schematic drawing of the present invention showing the angular position of the hood adjusted horizontally relative to the mounting shell.
Figure 8:
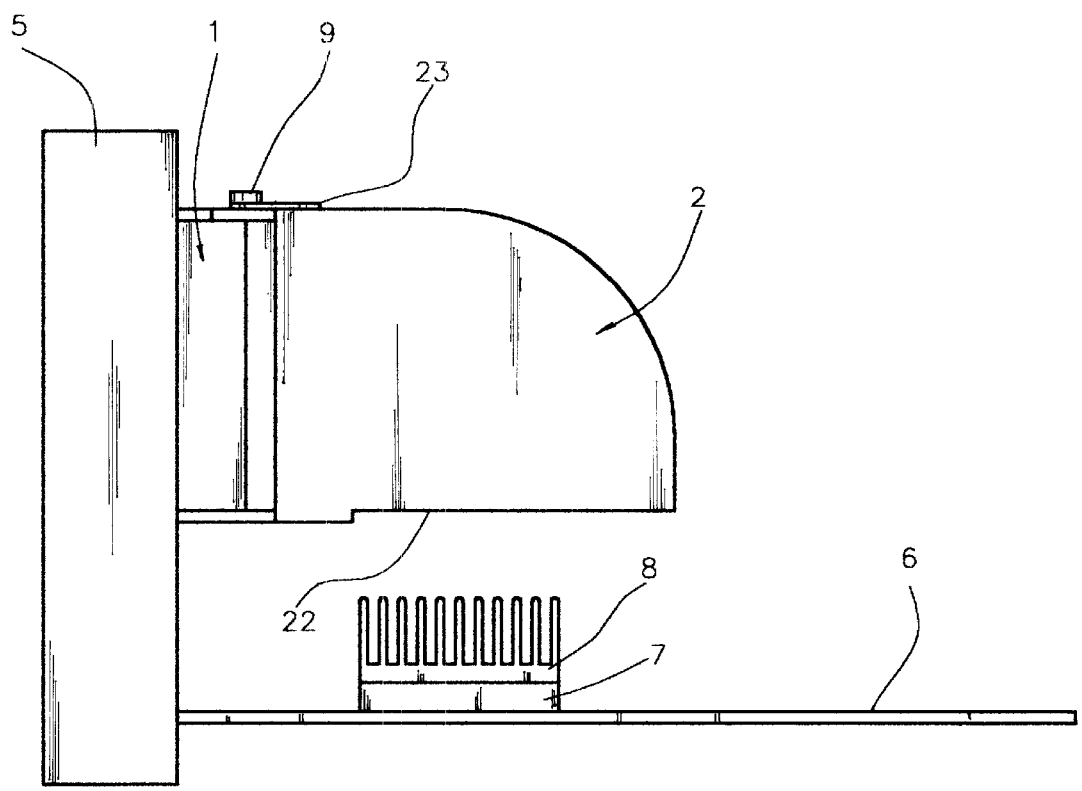
FIG. 8 is a side view of FIG. 5.

Referring to FIGS. 1, 2, and 5, a fan and hood arrangement in accordance with the present invention is shown comprised of a hollow mounting shell 1, a hood 2, and a fan 3.

The mounting shell 1 is a hollow shell comprising a fixed top nut 12 fixedly mounted on the top sidewall thereof, a front open side 11, a rear open side 16, a partition board 14 spaced between the front open side 11 and the rear open side 16, a plurality of ventilation holes 141 extended through the partition board 14, a plurality of mounting lugs 13 in the four corners around the rear open side 16, a plurality of spring plates 15 respectively extended from the four corners of the partition board 14, each spring plate 15 having a fixed end connected to the partition board 14 and a free end terminating in a retaining rod 151, and a plurality of stop blocks 161 disposed inside the front open side 16 and equally spaced from the partition board 14 in four corners at a predetermined distance.

The hood 2 has a rear opening 21 in the rear side thereof, a bottom exhaust hole 22 in the bottom side thereof, and an elongated slot 23 in the top sidewall thereof adjacent to the rear opening 21. The rear opening 21 and the bottom exhaust hole 22 are arranged at right angles. The front open side 11 of the mounting shell 1 is inserted into the rear opening 21 of the hood 2 for enabling the fixed top nut 12 to be extended out of the top sidewall of the hood 2 through the elongated slot 23, and then a lock screw 9 is threaded into the fixed top nut 12 to secure the mounting shell 1 to the hood 1 (see FIG. 1).

Figure 3:
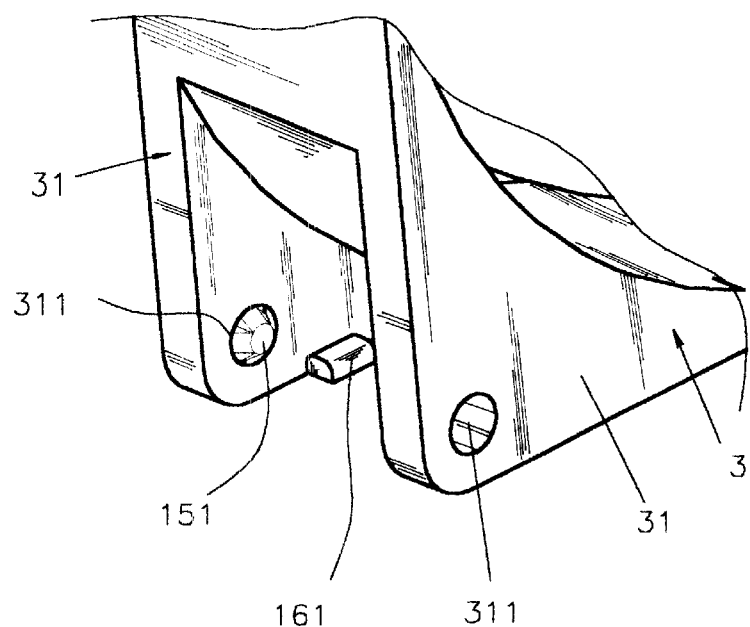
FIG. 3 is an enlarged view of a part of the fan for the fan and hood arrangement according to the present invention.
Figure 4:
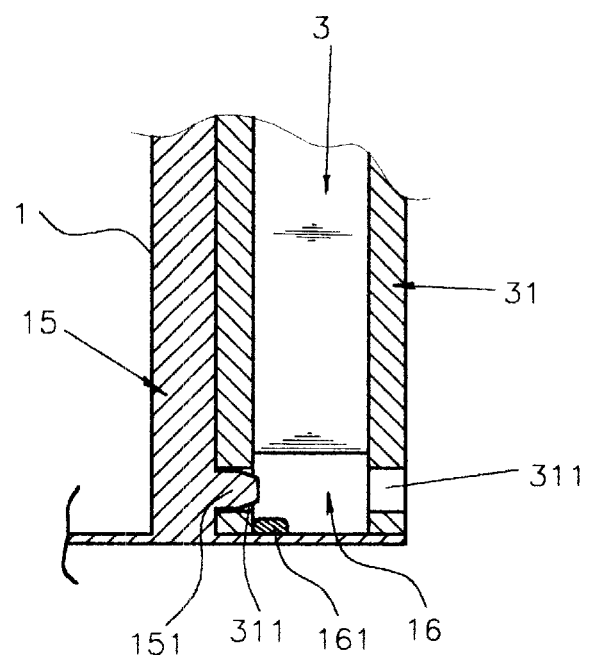
FIG. 4 is a sectional assembly view of a part of the present invention, showing the fan fastened to the mounting shell.

Referring to FIGS. 3 and 4 and FIG. 2 again, the fan 3 is mounted inside the rear open side 16 of the mounting shell 1 and supported on the partition board 14, comprising two mounting flanges 31 arranged in parallel at the front and rear sides. Each mounting flange 31 has a plurality of locating holes 311 in the four corners. After insertion of the fan 3 into the inside of the rear open side 16 of the mounting shell 1, one of the mounting flanges 31 is engaged into the gap between the stop blocks 161 and the partition board 14, and the retaining rods 151 of the spring plates 15 are respectively engaged into the locating holes 311 of the corresponding mounting flange 31 of the fan 3 to secure the fan 3 firmly to the mounting shell 1.

Referring to FIGS. from 6 through 8 and FIGS. 2 and 5 again, the ventilator is installed in a computer mainframe shell 5 and adapted to carry heat away from the heat sink 8 and the CPU 7 of the motherboard 6 in the computer mainframe shell 5. As illustrated, the lugs 13 of the mounting shell 1 are fixedly fastened to the computer mainframe shell 5 by respective tie screws 4. When installed, the bottom exhaust hole 22 of the hood 22 is aimed at the heat sink 8 and the CPU 7 of the motherboard 6. When the fan 3 started, cooling air is driven toward the heat sink 8 and the CPU 7 of the motherboard 6, thereby causing heat to be quickly dissipated from the CPU 7 and the heat sink 8.

Further, when the lock screw 9 loosened, the hood 1 can be turned about the fixed top nut 12 and the lock screw 9 and moved forwards/backwards relative to the mounting shell 1 to adjust the position of the exhaust hole 22 subject to the location of the CPU (heat sink).

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A fan and hood arrangement comprising:
   a mounting shell, said mounting shell comprising a fixed top nut at a top sidewall thereof, a front open side, a rear open side, a partition board spaced between said front open side and said rear open side, a plurality of ventilation holes extended through said partition board, a plurality of mounting lugs disposed around said rear open side for fastening to a computer mainframe shell by screws, a plurality of spring plates respectively extended from said partition board, said spring plates each having a free end terminating in a retaining rod, and a plurality of stop blocks disposed inside said front open side and spaced from said partition board at a distance;

a fan mounted inside the front open side of said mounting shell, said fan having a mounting flange engaged into the space between said stop blocks and said partition board, said mounting flange having a plurality of locating holes respectively forced into engagement with the retaining rod of each of said spring plates; and a hood adapted to guide currents of air from said fan to an area inside the computer mainframe shell in which said mounting shell is installed, said hood comprising a rear opening, which receives the front open side of said mounting shell, a bottom exhaust hole for output of currents of air from said fan, and an elongated slot in a top sidewall thereof, which receives said fixed top nut of said mounting shell for enabling said hood to be secured to said mounting shell and turned about said fixed top nut of said mounting shell; and a lock screw mounted in the elongated slot of said hood and threaded into said fixed top nut of said mounting shell and adapted to fixedly secure said hood to said mounting shell.

* * * * *